United States Patent [19]

Lischke et al.

[11] 4,168,434
[45] Sep. 18, 1979

[54] LONG FOCAL LENGTH MAGNETIC LENS FOR THE OPTICAL IMAGING OF A SPECIMEN HAVING A LARGE SURFACE AREA

[75] Inventors: Burkhard Lischke; Matthias Sturm, both of Berlin, Fed. Rep. of Germany

[73] Assignee: Siemens Aktiengesellschaft, Munich, Fed. Rep. of Germany

[21] Appl. No.: 870,068

[22] Filed: Jan. 17, 1978

[30] Foreign Application Priority Data

Jan. 19, 1977 [DE] Fed. Rep. of Germany ....... 2702439

[51] Int. Cl.² .............................................. G21K 1/08
[52] U.S. Cl. ......................... 250/396 ML; 250/396 R; 313/443; 335/212
[58] Field of Search ........................ 250/396 ML, 396; 335/212; 313/443

[56] References Cited

U.S. PATENT DOCUMENTS

| | | | |
|---|---|---|---|
| 2,714,678 | 8/1955 | Wolff | 250/396 ML |
| 3,526,766 | 9/1970 | Riecke | 258/396 ML |

*Primary Examiner*—Harold A. Dixon
*Attorney, Agent, or Firm*—Kenyon & Kenyon

[57] ABSTRACT

An improved magnetic lens having a long focal length for the optical imaging of a specimen having a large surface area by means of a charged-particle beam. The lens includes a cylindrical coil including at least one winding which is surrounded by a field-carrying metallic shell member fabricated of magnetic material disposed at the radially outer surface of winding. The improvement of the invention comprises a first ring member disposed on the radially outer surface of the metallic shell member approximately in the plane of the center of gravity of the lens; a plurality of slidable shoe members disposed on a lower surface of the first ring member; a housing fabricated of magnetic material surrounding the lens and including an annular shoulder on the radially inner surface thereof; a second ring member fabricated of non-magnetic material disposed on the annular shoulder for supporting the slidable shoe members, the shoe members being disposed between the first and second ring members; and at least three adjusting pin members distributed approximately uniformly over the surface of the housing and fabricated of non-magnetic material. The pin members extend through the housing and engage the first ring member of the metallic shell member for adjusting the position of the lens in a direction perpendicular to the axis of the lens.

6 Claims, 2 Drawing Figures

LONG FOCAL LENGTH MAGNETIC LENS FOR THE OPTICAL IMAGING OF A SPECIMEN HAVING A LARGE SURFACE AREA

BACKGROUND OF THE INVENTION

1. Field of the Invention

The present invention relates to a magnetic lens having a long focal length for the optical imaging of a specimen having a large surface area, i.e., a specimen having a diameter of several centimeters, by means of a charged-particle beam in an image plane which comprises a cylindrical coil including one winding, or alternatively, a plurality of separately-excitable windings, which is surrounded by a field-carrying metallic shell member fabricated of iron disposed at the radially outer surface of the winding.

2. Description of the Prior Art

Magnetic lenses of the foregoing type comprising a cylindrical coil including a single winding are known in the art and may be utilized, for example, as a field lens in an electron beam-optical reducing apparatus. See the journal "Optik", Volume 28, No. 5 (1968/1969), pages 518 through 531. Integrated circuits are fabricated using magnetic lenses of this type by imaging a transmission mask on a wafer.

A magnetic lens including a cylindrical coil comprising a plurality of separately-excitable windings is also known in the art. See U.S. Patent Application Ser. No. 805,474 filed June 10, 1977 for "Improved Long-Focus Magnetic Lens". This lens enables (a) the focal length to be changed while the excitation is maintained constant and (b) the entire field pattern to be shifted in the axial direction while the lens is fixed in space.

SUMMARY OF THE INVENTION

It is an object of the present invention to provide an improved magnetic lens having a long focal length for the optical imaging of a specimen having a large surface area by means of a charged-particle beam which includes a mounting enabling the position of the lens to be changed in a plane perpendicular to the optical axis of the equipment.

This and other objects of the invention are achieved in a magnetic lens having a long focal length for the optical imaging of a specimen having a large surface area by means of a charged-particle beam. The lens includes a cylindrical coil including at least one winding and being surrounded by a field-carrying metallic shell member fabricated of magnetic material disposed at the radially outer surface of the winding. The improvement comprises a first ring member disposed on the radially outer surface of the metallic shell member approximately in the plane of the center of gravity of the lens; a plurality of slidable shoe members disposed on a lower surface of the first ring member; a housing fabricated of magnetic material surrounding the lens and including an annular shoulder on the radially inner suface thereof; a second ring member fabricated of non-magnetic material disposed on the annular shoulder for supporting the slidable shoe members, the shoe members being disposed between the first and second ring members; and at least three adjusting pin members distributed approximately uniformly over the surface of the housing and fabricated of non-magnetic material. The pin members extend through the housing and engage the first ring member of the metallic shell member for adjusting the position of the lens in a direction perpendicular to the axis of the lens.

The improvement of the invention suspends the magnetic lens in the plane of the center of gravity. This has several advantages over supports disposed between two slip rings, which are customarily used in conventional pole-piece lenses. (See Siemens Elmiskop 102, Parts List June/July 1974.) In such pole-piece lenses, which are used, for example, in transmission-type electron microscopes, the dimensions of the gap and the bore hole are only a few millimeters. The overall height of the pole-piece lenses which result therefrom is less than 20 centimeters, and the shifting force which is used to adjust the lenses in a housing is supplied at the center of the frictional forces produced between the two slip rings.

Long-focus magnetic lenses of the type to which the subject invention relates are much larger in size than pole-piece lenses. For example, if specimens having a diameter of up to 10 centimeters are to be imaged, a lens having an overall height of approximately one meter and a weight of several hundred kilograms would have to be used. If a lens of that size were guided between two slip rings, movement of the lens could easily result in tilting which would jam the lens and prevent further movement. Suspending the lens in the plane of the center of gravity avoids this problem.

The foregoing type of suspension for the lens is also more advantageous in overcoming problems associated with vibrations. The vibration amplitude in the center of the lens, i.e., at the point of maximum field intensity and, thus, the greatest sensitivity for the imaging properties of the lens, cannot increase to a magnitude which is greater than the vibration amplitude of the housing of the lens. With respect to vibration characteristics, the lens can be compared to a long rod which is forcibly excited to vibrate at its middle portion. The fact that the vibration amplitudes at the ends of the rod (in a magnetic lens, at the ends of the lens) may be greater than the vibration amplitudes in the middle of the rod is of absolutely no consequence with respect to imaging properties since the magnetic field, and, therefore, the effect on the imaging rays of the charged-particle beam, is very small at the ends of the lens.

The mechanical coupling of the field-carrying shell member to the housing may be achieved by means of static friction between the slip ring and the internal ring of the housing. It is also important in the inventive apparatus that the slip ring consist of non-magnetic material, for example, iron-free bronze. The housing, which is fabricated of magnetic material, and the shell member, which is fabricated of magnetic material such as iron, surrounding the coil are, thus, magnetically decoupled. As a result, the component of the magnetic interference field directed along the lens axis (which is, so to speak, absorbed by the large iron housing and extends through the housing wall) cannot spill into the iron shell member surrounding the coil. Distortion of the magnetic field in the interior of the lens would otherwise occur since the magnetic field produced by the coil (or the coils, as the case may be) is returned by means of the iron shell member. On the other hand, it is not advisable to fabricate the housing of non-magnetic material since the shielding property perpendicular to the lens axis would become poorer by doing so.

In a preferred embodiment of the invention, the magnetic lens further comprises clamping means supported by a plurality of additional slidable shoe members fabricated of non-magnetic material which are disposed on an upper surface of the first ring member of the metallic shell member and are disposed between the clamping means and the first ring member. In this embodiment, the pin members are adapted for adjustment of the force of engagement of the first ring member by the pin members from outside the housing. This arrangement reinforces the mechanical coupling of the field-carrying shell member beyond the static friction between the slip ring and the internal ring of the housing.

Suspending the magnetic lens in the manner according to the invention enables the lens axis to be made to coincide with the optical axis of the equipment by shifting the lens. It is already possible to shift the effective lens center in the direction of the axis by subdividing the coil of the lens into several separately-excitable windings, as disclosed in the afore-mentioned pending patent application.

Lenses are also known in the art in which the field-carrying iron shell member is extended parallel to the lens axis beyond the end faces of the coil in the form of pole cylinders. This makes the external stray field negligibly small and permits an advantageous field-intensity pattern inside the lens to be adjusted so that imaging errors become very small overall. In order to completely adjust the lens, or rather the effective magnetic field, it may be necessary to tilt the lens slightly in some cases so that its axis coincides with the optical axis. Since only the field pattern and not the position of the mechanical portion of the lens is important, however, it is sufficient to tilt the field accordingly. In a further embodiment of the invention, this is achieved by a metallic shell member which extends parallel to the axis of the lens beyond the end faces of the coil so as to form pole cylinders at each end of the shell member, and by a lens which includes means for varying the relative position of at least one of the pole cylinders with respect to the metallic shell member in a direction perpendicular to the axis of the lens. If the pole cylinder is shifted somewhat perpendicular to the lens axis, it causes a distortion of the field pattern in such a manner that it corresponds to tilting the lens. Since the tilt angles are always very small, no appreciable degradation of the imaging properties of the lens occur as a result of this field distortion.

These and other novel features and advantages of the invention will be described in greater detail in the following detailed description.

BRIEF DESCRIPTION OF THE DRAWINGS

In the drawings, wherein similar reference numerals denote similar elements throughout the several views thereof.

DETAILED DESCRIPTION

Figure 1:
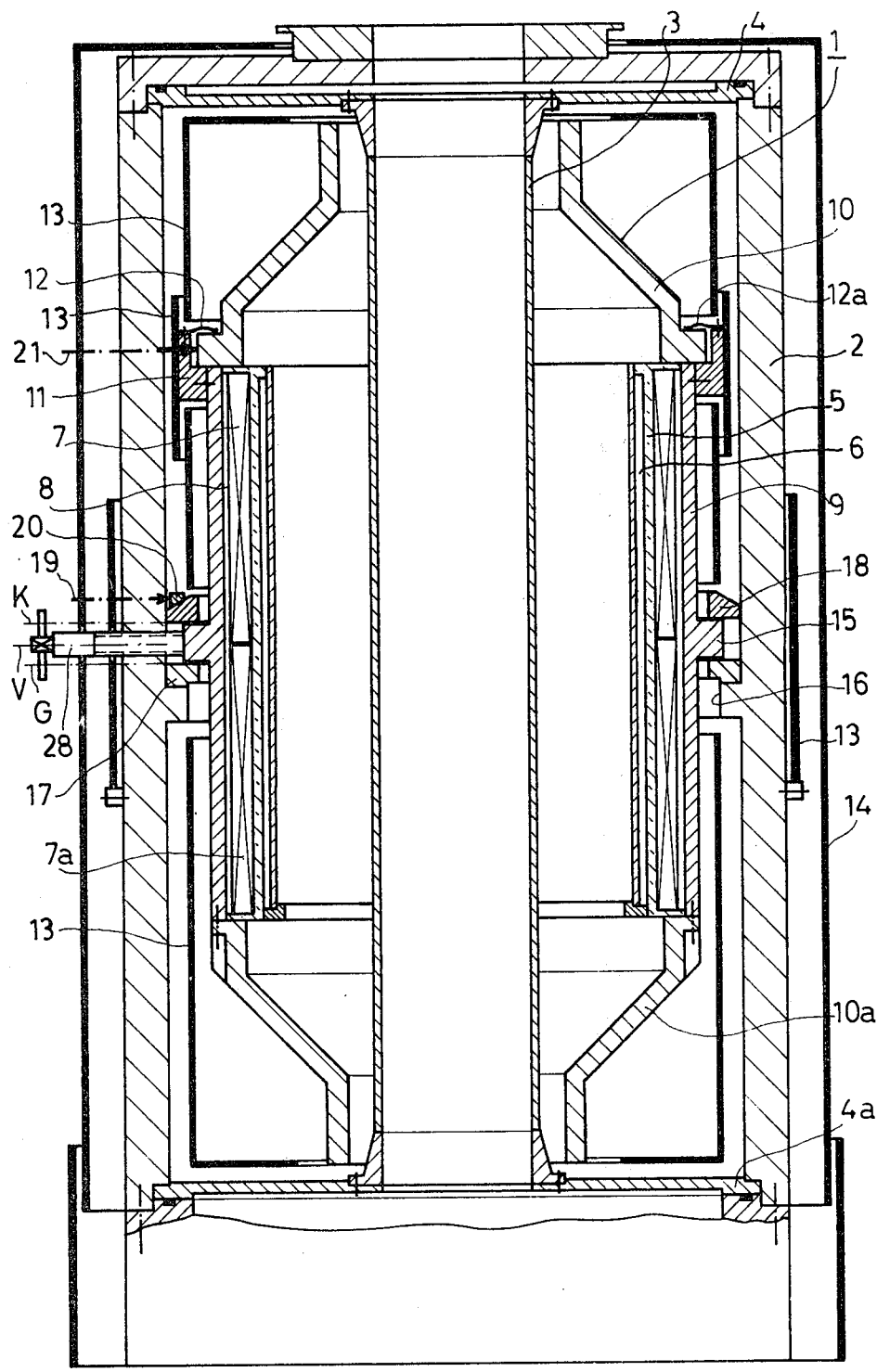
FIG. 1 is a cross-sectional longitudinal view of an improved magnetic lens constructed according to the present invention.

Referring now to the drawings, there is shown in FIG. 1 a magnetic lens 1 which is suspended in a housing 2. The lens includes a vacuum tube 3 which is coupled at both ends to the housing 2 in a vacuum-tight manner by means of metal rings 4 and 4a. A coil form 5 including a cooling system 6 is disposed around the vacuum tube 3 and supports a coil 8 comprising two separately-excitable windings 7 and 7a. A field-carrying metallic shell number 9 which is fabricated of magnetic material, specifically iron, surrounds the outer surface of coil 8 and extends outwardly parallel to the lens axis beyond the end faces of the coil in the form of pole cylinders 10 and 10a.

Lower pole cylinder 10a is connected to shell member 9 but the upper pole cylinder 10 is movably supported on shell number 9 and coil form 5. A ring 11 connected to the shell member 9 limits the lateral movement of pole cylinder 10. Several leaf springs 12 and 12a are distributed over the circumference of the ring and are firmly connected at one end to the ring. These leaf springs press pole cylinder 10 onto the shell member 9 so that the axial position of the pole cylinder is secured. An inner shield 13, fabricated of mu metal, is disposed around ring 11. This shield is designed with some overlap further outward from the ring in those areas where a direct continuation of the shield is not possible because of projections at the lens. The outer portion of the lens is formed by housing 2 and an additional outer shield 14 which is also fabricated of mu metal. The mu metal of the shield is preferably soft-annealed in order to further increase the shielding affect of the iron housing 2.

Shell member 9 has on its outer surface an annular ring member 15 located in the center of gravity plane. The plane of the center of gravity coincides, in the embodiment of the invention illustrated, with the geometrical center plane of the lens. It should be noted, however, that this will not and need not be the case where, for example, the pole cylinders have different sizes and shapes. An annular shoulder 16 is provided on the inner surface of housing 2 slightly below the center of gravity plane. A ring member 17 fabricated of non-magnetic material, for example, iron-free bronze, is disposed on shoulder 16. Ring member 15 of the shell member 9, and, thus, the entire lens, is supported by ring member 17. A mechanical coupling between the lens 1 and the housing 2 which is stress-free and positively connected because of the static friction between the shoulder and the ring members is thereby assured.

Mechanical coupling of the lens to the housing beyond the static friction is further reinforced by a clamping device which, in the embodiment of the invention illustrated in FIG. 1, comprises a ring member 18 fabricated of non-magnetic material which is bevelled on its top surface. The engagement force, i.e., the pressure with which ring member 18 engages and pushes the lens against the housing, is adjustable from outside the lens housing, as indicated by the action line 19 and the wedge 20. An adjusting pin 28 extends through the housing and the inner and outer shields. Two additional adjusting pins (not shown in FIG. 1), each spaced apart by an angle of 120°, are also used to adjust the pressure force with which ring member 18 pushes the lens against the housing. At least three adjusting pins are required to adjust the lens 1 within the plane perpendicular to the lens axis. More than three adjusting pins may, of course, by used.

Adjusting pin 28 is fabricated of non-magnetic material in the embodiment of the invention illustrated in FIG. 1. It is, thus, assured that overall, the field-carrying shell member 9 is not magnetically coupled to housing 2 either directly or by means of any connecting parts. The magnetic flux captured by housing 2 is thereby prevented from spilling over in the direction of the lens axis onto the shell member 9 of the lens and thereby causing objectionable distortion of the magnetic field inside the lens. Action line 21 in FIG. 1 indicates movement of the upper pole cylinder 10 perpendicular to the lens axis in a manner similar to movement of the entire lens 1. The movement of the upper pole cylinder is, however, independent of the movement of the lens. It is particularly advantageous if the lens is designed so that atmospheric pressure prevails outside vacuum tube 3 and thereby on both sides of pole cylinder 10. This eliminates the need to overcome additional forces caused by pressure differences when shifting pole cylinder 10.

By shifting pole cylinder 10, the magnetic field may be distorted in such a manner that the effective lens axis no longer coincides with the geometrical axis of the lens. Thus, it is possible to align the optically effective lens axis parallel to the optical axis of the equipment. It is also possible to make this aligned lens axis coincide with the optical axis of the equipment by shifting the entire lens in a direction perpendicular to its axis. In addition, the lens center may be shifted upwardly or downwardly in the direction of the optical axis by utilizing a coil constructed of a plurality of separately-excitable windings and by exciting the individual windings in a different manner. As can be seen from the embodiment of the invention illustrated in FIG. 1, the slide plane G, the adjustment plane V, and the clamping plane K are located so close together, compared with the total length of the magnetic lens, that a tilting movement is, for all practical purposes, prevented while the lens 1 is adjusted.

Figure 2:
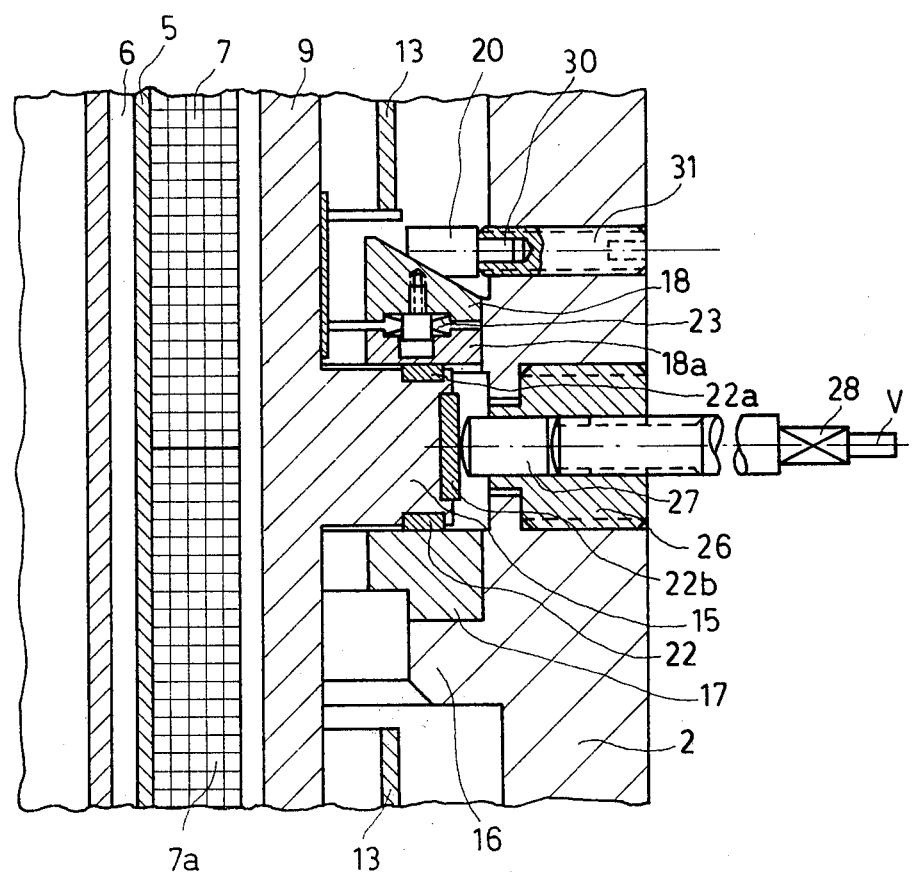
FIG. 2 is a partial, cross-sectional view of the magnetic lens illustrated in FIG. 1.

FIG. 2 illustrates a modified embodiment of the invention and shows coil form 5, cooling system 6, the separate windings 7 and 7a wound on coil form 5, and the field-carrying shell member 9 which is surrounded by inner shield 13 and housing 2. Annular ring member 15 of shell member 9 has three annular depressions provided on the upper and lower surfaces thereof into which a plurality of slide shoe members 22 and 22a and, on the side of ring member 15 opposite adjusting pin 28, an intermediate slide member 22b, are pressed. Ring member 15 of shell member 9 is supported by the slide shoe members 22 on ring member 17 and, thus, the entire lens is supported on shoulder 16 of housing 2. The housing has three apertures distributed over the circumference of the housing in the center of gravity plane of the lens into which bushings 26 are inserted. A bolt 27 is slidably disposed in the end of the bushing 26 facing the lens and the other end of the bushing is provided with a thread into which a toggle 28 is screwed. The bolt 27 can be forced more or less against the intermediate member 22b by moving the toggle 28 and this makes it possible to shift the lens relative to the housing. The bolt 27 is fabricated of non-magnetic material and, thus, the toggle 28 may be fabricated of magnetic material, for example, iron or steel.

In this embodiment of the invention, the clamping device comprises two clamping ring members 18 and 18a. Multiple cup springs 23 are disposed between these clamping ring members and push the clamping ring members apart. The ring members are positively coupled to ring member 15 of shell member 9 by means of slide shoe members 22a. Wedge 20 and a pin 30 are slidably disposed in a blind hole of an adjusting pin 31 which is screwed into a tapped hole of housing 2. Because of the guidance force of wedge 20 and clamping ring members 18 and 18a, the clamping ring members can move only downwardly if wedge 20 is moved towards the lens center by adjusting pin 31. As a result, a clamping effect of variable magnitude can be achieved.

Clamping devices of other designs may, of course, be utilized. The bevel at the clamping ring member 18 and wedge 20 may be replaced, for example, by an eccentric provided at the front end of adjusting pin 31 which is rotated by lever action outside housing 2 and pushes on clamping ring 18a. It is also possible to dispose the clamping device outside the plane defined by the lens axis and the adjusting pin 28. This was done in the embodiment illustrated in order to show both devices in one cross-sectional drawing.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a magnetic lens having a long focal length for the optical imaging of a specimen having a large surface area by means of a charged-particle beam, said lens including a cylindrical coil including at least one winding and being surrounded by a field-carrying metallic shell member fabricated of magnetic material disposed at the radially outer surface of said winding, the improvement comprising a first ring member disposed on the radially outer surface of said metallic shell member approximately in the plane of the center of gravity of said lens, a plurality of slidable shoe members disposed on a lower surface of said first ring member, a housing fabricated of magnetic material surrounding said lens, said housing including an annular shoulder on the radially inner surface thereof, a second ring member fabricated of non-magnetic material disposed on said annular shoulder for supporting said slidable shoe members, said shoe members being disposed between said first and second ring members, and at least three adjusting pin members distributed approximately uniformly over the surface of said housing and fabricated of non-magnetic material, said pin members extending through said housing and engaging said first ring member of said metallic shell member for adjusting the position of said lens in a direction perpendicular to the axis of said lens.

2. The magnetic lens recited in claim 1, wherein the surface area of said specimen is approximately several centimeters in diameter.

3. The magnetic lens recited in claim 1, wherein said cylindrical coil includes a plurality of separately-excitable windings.

4. The magnetic lens recited in claim 1, wherein said metallic shell member is fabricated of iron.

5. The magnetic lens recited in claim 1, further comprising clamping means supported by a plurality of additional slidable shoe members fabricated of non-magnetic material disposed on an upper surface of said first ring member of said metallic shell member said additional slidable shoe members being disposed between said clamping means and said first ring member, and wherein said pin members are adapted for adjustment of the force of engagement of said first ring member by said pin members from outside said housing.

6. The magnetic lens recited in claim 1, wherein said metallic shell member extends parallel to the axis of said lens beyond the end faces of said coil so as to form pole cylinders at each end of said shell member, said lens including means for varying the relative position of at least one of said pole cylinders with respect to said metallic shell member in a direction perpendicular to the axis of said lens.

* * * * *